(12) United States Patent
Gloisten et al.

(10) Patent No.: US 7,198,387 B1
(45) Date of Patent: Apr. 3, 2007

(54) LIGHT FIXTURE FOR AN LED-BASED AIRCRAFT LIGHTING SYSTEM

(75) Inventors: Jennifer L. Gloisten, Farmingville, NY (US); Tolek Pawelko, Deer Park, NY (US)

(73) Assignee: B/E Aerospace, Inc., Wellington, FL (US)

( * ) Notice: Subject to any disclaimer, the term of this patent is extended or adjusted under 35 U.S.C. 154(b) by 3 days.

(21) Appl. No.: 11/016,449

(22) Filed: Dec. 17, 2004

Related U.S. Application Data

(60) Provisional application No. 60/530,492, filed on Dec. 18, 2003.

(51) Int. Cl.
    F21V 29/00    (2006.01)
    F21V 7/20     (2006.01)
    F21V 1/00     (2006.01)
    F21S 8/10     (2006.01)

(52) U.S. Cl. ............... 362/294; 362/545; 362/218; 362/238

(58) Field of Classification Search ............ 362/249, 362/219, 294, 800, 218, 227, 231, 240, 235–238, 362/457, 545, 555
    See application file for complete search history.

(56) References Cited

U.S. PATENT DOCUMENTS

| | | | |
|---|---|---|---|
| 4,962,687 A | 10/1990 | Belliveau et al. | |
| 5,677,603 A | 10/1997 | Speirs et al. | |
| 5,713,654 A | 2/1998 | Scifres | |
| 5,785,418 A * | 7/1998 | Hochstein | 362/373 |
| 5,803,579 A | 9/1998 | Turnbull et al. | |
| 6,016,038 A | 1/2000 | Mueller et al. | |
| 6,132,072 A | 10/2000 | Turnbull et al. | |
| 6,152,588 A | 11/2000 | Scifres | |
| 6,335,548 B1 | 1/2002 | Roberts et al. | |
| 6,441,943 B1 | 8/2002 | Roberts et al. | |
| 6,517,218 B2 * | 2/2003 | Hochstein | 362/294 |
| 6,523,976 B1 | 2/2003 | Turnbull et al. | |
| 6,548,967 B1 | 4/2003 | Dowling et al. | |
| 6,577,080 B2 | 6/2003 | Lys et al. | |
| 6,608,453 B2 | 8/2003 | Morgan et al. | |
| 6,623,151 B2 | 9/2003 | Pederson | |
| 6,624,597 B2 | 9/2003 | Dowling et al. | |
| 6,672,745 B1 | 1/2004 | Bauer et al. | |
| 6,874,910 B2 * | 4/2005 | Sugimoto et al. | 362/294 |
| 6,930,332 B2 * | 8/2005 | Hashimoto et al. | 257/98 |
| 6,932,495 B2 * | 8/2005 | Sloan et al. | 362/294 |
| 6,966,674 B2 * | 11/2005 | Tsai | 362/294 |
| 2003/0011538 A1 | 1/2003 | Lys et al. | |
| 2003/0048641 A1 | 3/2003 | Alexanderson et al. | |
| 2003/0057887 A1 | 3/2003 | Dowling et al. | |

(Continued)

*Primary Examiner*—John Anthony Ward
*Assistant Examiner*—David Makiya
(74) *Attorney, Agent, or Firm*—Drinker Biddle & Reath LLP

(57) ABSTRACT

A light fixture for housing LED units is provided. The light fixture has a housing that has a substantially H-shaped cross section. The housing has a crossbar with a series of mesas defined on its upper surface. A group of LED units is attached to each of the series of mesas, each LED unit being attached with a thin layer of adhesive. The LED units are electrically insulated from the housing by either the adhesive, which may be electrically insulating, or by an electrically insulating coating on the housing.

20 Claims, 3 Drawing Sheets

U.S. PATENT DOCUMENTS

| | | |
|---|---|---|
| 2003/0057890 A1 | 3/2003 | Lys et al. |
| 2003/0072157 A1 | 4/2003 | Nolan et al. |
| 2003/0133292 A1 | 7/2003 | Mueller et al. |
| 2003/0156425 A1 | 8/2003 | Turnbull et al. |
| 2003/0227774 A1 | 12/2003 | Martin et al. |
| 2004/0032745 A1 | 2/2004 | Pederson |
| 2004/0052076 A1 | 3/2004 | Mueller et al. |
| 2005/0168990 A1* | 8/2005 | Nagata et al. .............. 362/294 |

* cited by examiner

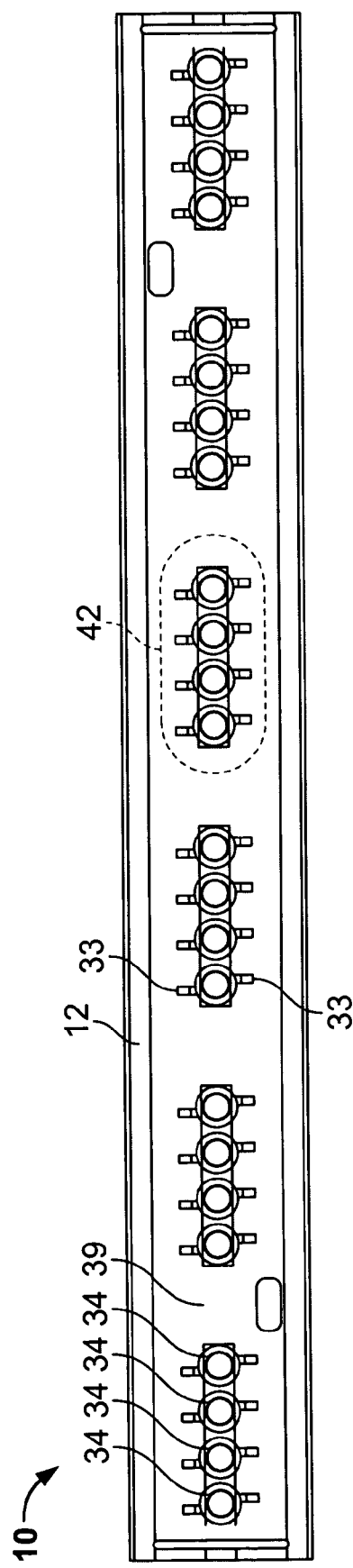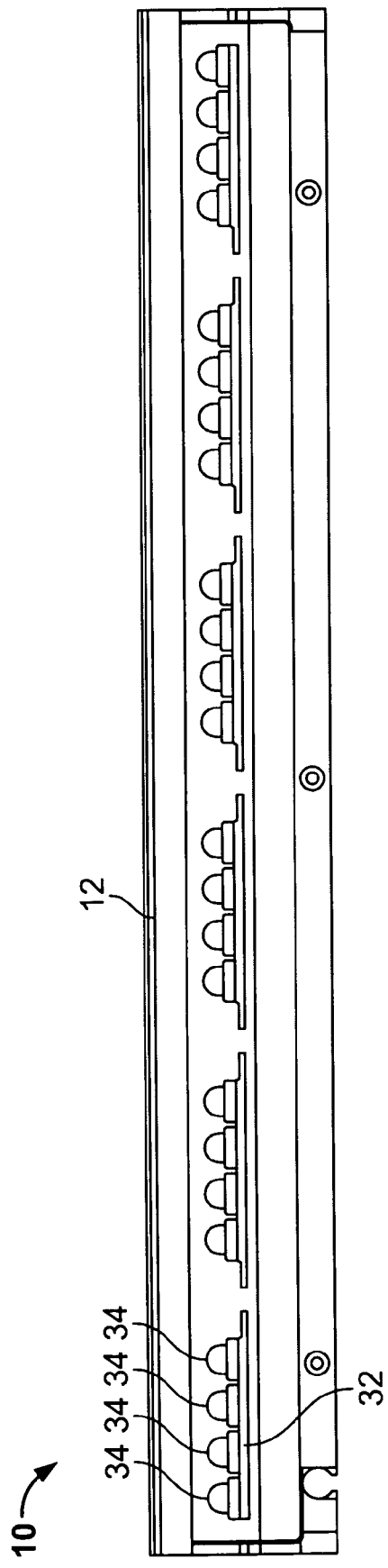

LIGHT FIXTURE FOR AN LED-BASED AIRCRAFT LIGHTING SYSTEM

CROSS-REFERENCE TO RELATED APPLICATIONS

The present application claims the benefit of the filing date of U.S. Provisional Application No. 60/530,492, filed Dec. 18, 2003, which is hereby incorporated by reference in its entirety.

FIELD OF THE INVENTION

This invention pertains to light fixtures and, more particularly, to light fixtures that use light-emitting diodes and structures or materials that dissipate heat generated by the light-emitting diodes.

BACKGROUND OF THE INVENTION

Lighting systems for aircraft interiors are well known. Conventional lighting systems include the use of fluorescent lights to brighten the inside of an aircraft cabin. Fluorescent light is used because it provides lighting sufficient to illuminate the cabin so as to provide an environment that allows passengers and cabin personnel to work and function comfortably. In addition to light intensity, other advantages of fluorescent light include the fact that it is energy efficient and highly reliable, factors that are critical to commercial aviation. A problem associated with fluorescent lighting is that it can, over an extended period of time, become fatiguing to persons constantly exposed to the light. Furthermore, while the light can be dimmed or brighten, the color of the light cannot be changed.

An alternative to fluorescent lighting is light-emitting diode (LED) based light. LEDs are also energy efficient but are easier on the eyes of passengers. When employing LEDs in an aircraft cabin, it is necessary to ensure that the heat generated by the LEDs is adequately drawn away. Otherwise, there is a risk that the semiconductor material of the LEDs will degrade quickly, thereby requiring frequent replacement of the LEDs.

BRIEF SUMMARY OF THE INVENTION

The invention is generally directed to a light fixture suitable for use in an aircraft. The light fixture is comprised of a housing made of thermally conductive material, a circuit board supported by the housing, and at least one light emitting diode unit.

BRIEF DESCRIPTION OF THE DRAWINGS

FIG. 1 is a top view of a light fixture configured according to an embodiment of the invention;

FIG. 2 is a side view of a light fixture configured according to an embodiment of the invention;

DETAILED DESCRIPTION OF THE INVENTION

Figure 3:
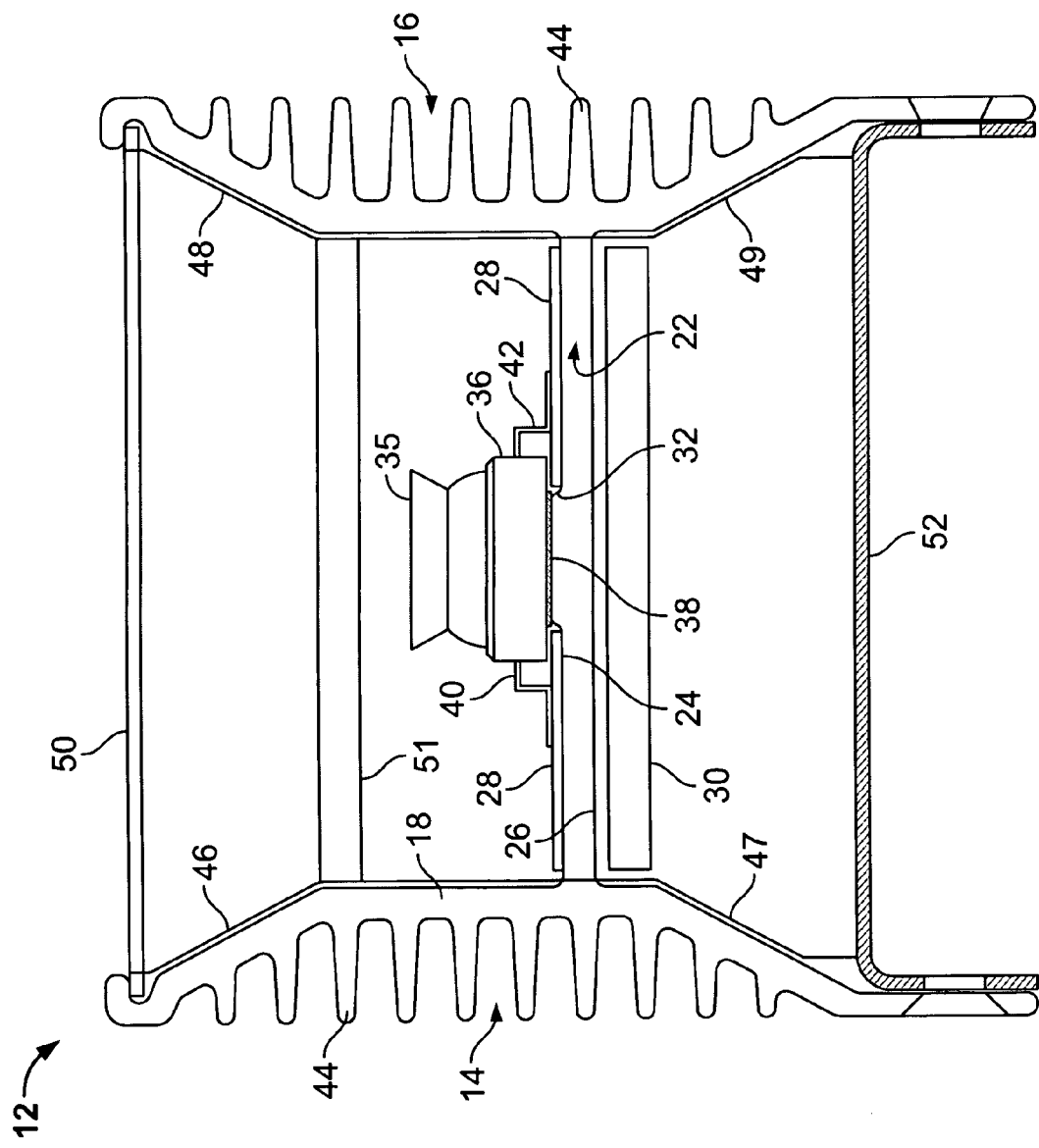
FIG. 3 is an end view of a light fixture configured according to an embodiment of the invention.

The invention is generally directed to a light fixture for use in an LED lighting system for an aircraft. Referring to FIGS. 1–3, an embodiment of the light fixture, generally labeled 10, includes a housing 12 having a first side 14 and a second side 16. The first and second sides 14 and 16 are displaced from one another. The first side 14 has an inner surface that has an angled upper portion 46, a substantially straight portion 18, and an angled lower portion 47. The second side 16 has an inner surface that has an angled upper portion 48, a substantially straight portion 20, and an angled lower portion 49. The length of the first side 14 is longer that the height of the first side 14. Similarly, the length of the second side 16 is longer that the height of the second side 16. A crossbar 22 is connected to the substantially straight portion 18 of the inner surface of the first side 14 at substantially at the mid-point of the height of the first side 14. The crossbar 22 is also connected to the inner surface 20 of the second side 16 at substantially the mid-point of the height of the second side 16. The cross-bar 22 has an upper surface 24 and a lower surface 26, and extends from the substantially straight portion of the inner surface of the first side 14 to the substantially straight portion 20 of the inner surface of the second side 16. The upper portion 46 and substantially straight portion 18 of the inner surface of the first side 14, the upper surface 24 of the crossbar 22, and the upper portion 48 and substantially straight portion 20 of the inner surface of the second side 16 together define a first channel. Similarly, the lower portion 47 and substantially straight portion 18 of the inner surface of the first side 14, the lower surface 26 of the crossbar 22, and the lower portion 48 and substantially straight portion 20 of the inner surface of the second side 16 together define a second channel. As can be seen in FIG. 3, the profile of the housing 12 is substantially H-shaped.

Referring again to FIG. 3, a first printed circuit board (PCB) 28 is attached to the upper surface 24 of the crossbar 22. A thermal pad (not shown) is attached to the lower surface 24 of the crossbar 22. A second PCB 30 is attached to the lower surface 26 of the crossbar 22 such that the thermal pad is sandwiched between the second PCB 30 and the crossbar 22. The first and second PCBs 28 and 30 and the thermal pad are secured to the crossbar 22 by screws that are threaded through press fit inserts in the crossbar 22 and/or PCBs 28 and 30. The thermal pad carries heat from the PCB 28 into the housing 12 via the crossbar 22.

Referring again to FIG. 3, the upper surface 24 of the crossbar 22 defines a series of mesas 32 that run along the length of the crossbar 22. As shown in FIGS. 1–2, disposed on top of the mesas 32 are twenty-four LED units, including six groups 42 of four LED units each. Each group 42 of LED units is disposed on one of the mesas 32. Within each group 42 of LED units, there are four individual LED units 34—a white LED unit, a blue LED unit, a green LED unit, and a red LED unit. It is to be understood that any number, grouping, or color combination of LED units is possible, however. For example, in one embodiment, there are twenty LED units, including five groups of four LED units each. In another embodiment, there are white and amber LED units, with a 2:1 ratio of white LED units to amber LED units. In yet another embodiment, there are green and red LED units, with a 2:1 ratio of green LED units to red LED units. Furthermore, any suitable style of LED unit may be used, including Lambertian or side emitter. The LED units 34 are mounted in a linear configuration, and may be evenly spaced or grouped for optimum light mixing. In an embodiment of the invention, multiple light units 12 are deployed in an aircraft cabin and the groups of red, green, blue and white LED units of the light fixtures allows for the generation of white light in excess of 30 footcandles and accent lighting of any color (i.e., 16,777,216 different colors).

Referring back to FIG. 3, the manner in which each of the LED units is physically and electrically connected will now be described. Each LED unit 34 has a lens 35 and a metallic base portion 36. The dome portion 35 houses a high flux LED, whose heat is dissipated through the metallic base portion 36. The base portion 36 is attached to the mesa 32 of the crossbar 22 with an adhesive material 38 that is electrically insulating, thereby preventing stray current from leaking to the housing 12. In some embodiments, however, the mesa 32 of the crossbar 22 is coated with an electrically insulating paint, thereby allowing the use of an electrically conductive substance as the adhesive material 38. The adhesive material 38 may also have a low thermal conductivity, but be applied in a thin enough layer (e.g. 1/3000th of an inch) to allow sufficient heat to dissipate into the housing 12 from the LED unit 34. One possible type of adhesive material that may be used is an RTV silicone adhesive. The first PCB 28 has cutouts for receiving the mesa 32 and the base portion 36 of the LED unit 34.

A first wire 40 electrically connects the positive lead of the LED unit 34 to a first conductor run on the first PCB 28, and a second wire 42 electrically connects the negative lead of the LED unit 34 to a second conductor run on the first PCB 28. The first and second conductor runs are electrically connected to drive circuitry located on the second PCB 30.

Certain features of the housing 12 will now be described with reference to FIG. 3. The housing 12 is made of a thermally conductive material, such as aluminum, which is coated with a finish that inhibits the flow of electric current. When heat from the LED units 34 reaches the housing 12 (via the base portion 36, through the adhesive material 38, through the mesa 32, through the crossbar 22), it conducts throughout the housing 12. The sides 14 and 16 of the housing 12 have fins 44 that radiate the heat.

Another feature of the housing 12 is that it enhances the overall lighting qualities of the light fixture 10. For example, above the crossbar 22, the substantially straight portions 18 and 20 of the inner surfaces of the first and second sides 14 and 16 of the housing 12 are prepared with a reflective material, such as reflective tape, so that the substantially straight portions 18 and 20 mix the light emitted by the LED units 34 to provide consistency of light patterns along the length of the housing 12. The angled portions 46 and 48 of the inner surfaces of the first and second sides 14 and 16 of the housing are also prepared with a reflective material, such as reflective tape, and slope toward the LED unit 34, thereby approximating a parabolic reflector. This configuration is intended to collimate light at the edge of the distribution area of the LED units 34. Such light might otherwise be inefficiently reflected around the inside of the housing 12. The reflective material also helps to smooth light transitions between different colored LED units 34.

The inner surfaces of the first and second sides housing 12 (FIG. 3) each have a lengthwise channel. A lens 50 is disposed within these lengthwise channels. The lens 50 may be manufactured from flame resistant polycarbonate or any other material that meets the requirements of Federal Aviation Regulation 25.853. The lens 50 is formed with downward folds at its ends such that it acts as an end closure for the top part of the housing 12.

The housing 12 also includes a thin, formed aluminum cover 52 that protects drive circuitry mounted on the PCB 30. Edges of the cover 52 fold upward to lay parallel to the bottom edges of the first and second sides 14 and 16 of the housing 12, thereby allowing assembly with simple hardware or swaged rivets. The downward end folds of the lens 50 are constrained by the upward end folds of the cover 52 without the need for additional hardware. When installed in an aircraft, a wire harness passes downward through grommets or cable clamps at either one or both ends of the cover 52, which allows light fixtures to be chained together sequentially.

In an embodiment of the invention, the packaging of the lighting electronics of the light fixture 10 (FIGS. 1–3) is designed to provide shielding for radiated electromagnetic interference (EMI) by enclosing the circuitry in a ground conductive chassis. A copper ground plane 39 is disposed on top of the first PCB 28. The mounting hardware of the first and second PCBs 28 and 30 connects the copper ground plane 39 to the chassis. Furthermore, conductors on the first PCB 28, including the first and second conductor runs, run primarily on the bottom of the first PCB 28, and are thus shielded by this copper ground plane 39. Also, the thin sheet metal of the bottom cover 52 is grounded to the housing 12 and can offer shielding.

Figure 4:
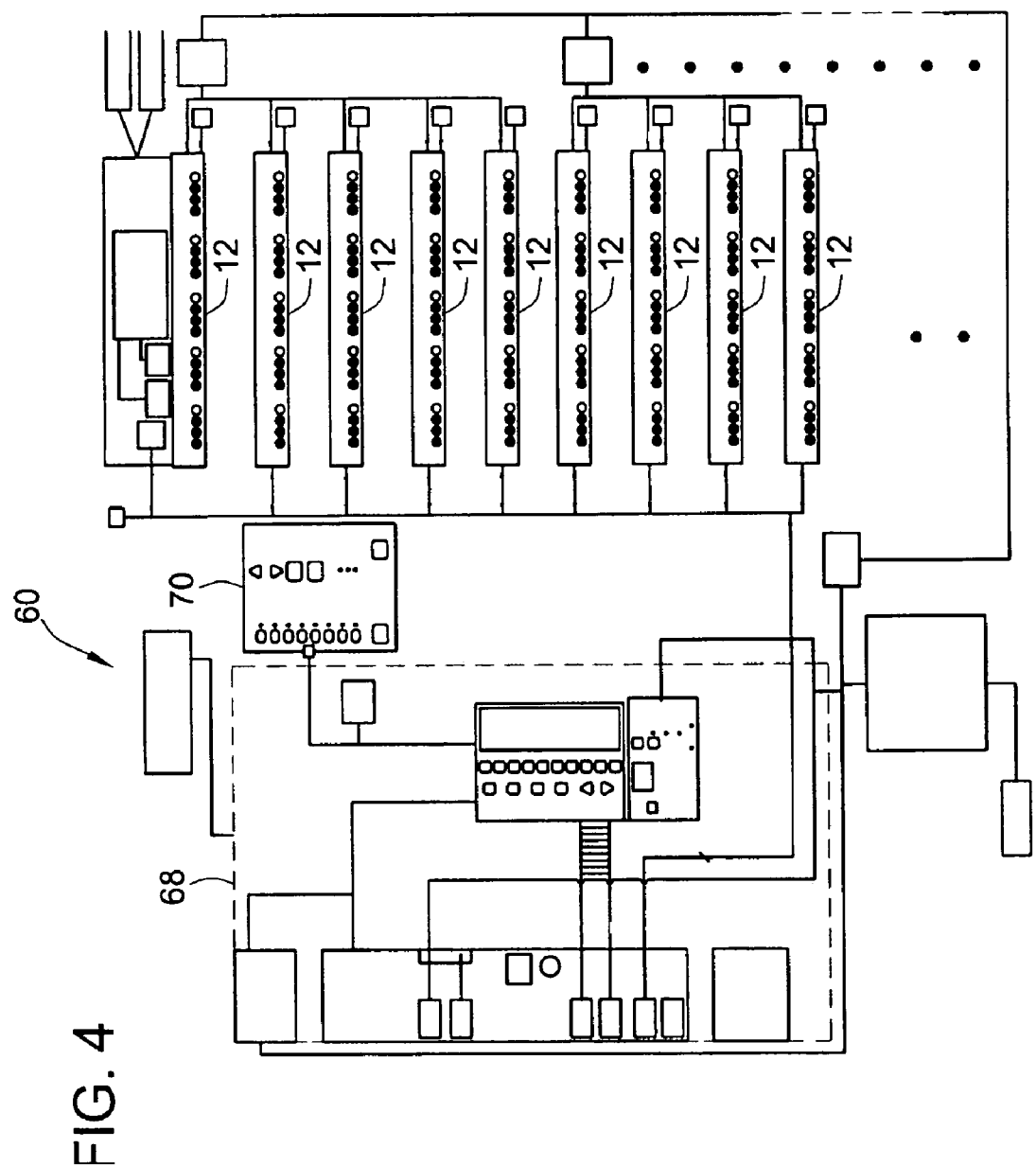
FIG. 4 is an example of a system in which an embodiment of the light fixture described herein may be used.

An example of a lighting system in which the invention may be used is shown in FIG. 4. The lighting system, generally labeled 60, includes multiple light fixtures 62. Each light fixture 12 is electrically connected to the system 60 at a specific location along a wiring harness. The system 60 also includes a master controller 68 and multiple cabin controllers 70. The master controller 68 executes one or more lighting programs and, according to the program being executed, transmits data to each of the light fixtures 12 in order to create lighting effects throughout the cabin of an aircraft. The flight crew can select which program should be executed by using the cabin controllers 70.

In can be seen from the foregoing that a new and useful light fixture for an LED-based aircraft lighting system has been described. Although example embodiments of the present invention have been described in detail, those skilled in the art will readily appreciate that many modifications are possible to these embodiments without materially departing from the invention. Accordingly, all such modifications are intended to be included within the scope of this invention.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

What is claimed is:

1. A light fixture comprising:
    a housing made of thermally conductive material, wherein the housing includes a first side, a second side, and a crossbar connecting the first side to the second side, wherein the second side is displaced from the first side, wherein the crossbar has an upper surface and a lower surface, and the printed circuit board is attached to the upper surface of the crossbar,
    a printed circuit board supported by the housing; and
    a light emitting diode unit that is mounted on the housing with a layer of adhesive, the light emitting diode having leads that are electrically connected to the printed circuit board, wherein an electrically insulating material is disposed between the light emitting diode unit and the housing, wherein at least one mesa extends along the upper surface of the crossbar, the printed circuit board includes an opening that accommodates a metal back surface of the light emitting diode unit, and a thermal path extends from back surface of the light emitting diode unit to the at least one mesa.

2. The light fixture of claim 1, wherein the light emitting diode unit is part of a group of light emitting diode units, wherein the group of light emitting diode units includes light emitted diode units that each emit light whose color is different than the light of the other light emitting diode units of the group.

3. The light fixture of claim 1, wherein the layer of adhesive has a low thermal conductivity.

4. The light fixture of claim 1, wherein the layer of adhesive material is electrically insulating.

5. The light fixture of claim 1, wherein the housing is made of aluminum.

6. The light fixture of claim 1, wherein the electrically insulating material is the layer of adhesive.

7. The light fixture of claim 1, wherein the layer of adhesive is electrically conductive.

8. The light fixture of claim 1, wherein the metal back surface of the light emitting diode unit is attached to the mesa through the opening.

9. The light fixture of claim 1, wherein the housing comprises a thermally conductive material that is coated with a finish that inhibits the flow of electric current.

10. The light fixture of claim 1, wherein the layer of adhesive has a low thermal conductivity, the layer being sufficiently thin to permit head to dissipate into the housing from the light-emitting diode unit.

11. A light fixture comprising:
a housing comprising:
a first side and a second side, the first side comprising an inner surface having a substantially straight portion, the second side comprising an inner surface having a substantially straight portion,
wherein the inner surface of the first side of the housing has an angled portion, and the inner surface of the second side of the housing has an angled portion, wherein the angled portions of the inner surfaces of each of the first and second sides are covered in a reflective material, the effect of which is to approximate a parabolic reflector;
a crossbar attached to the substantially straight portion of the first side and to the substantially straight portion of the second side, the cross bar comprising an upper surface and a lower surface, wherein a mesa is defined on the upper surface, the mesa being substantially parallel to the straight portions of the first and second sides of the housing;
a light emitting diode unit having a lens, a base portion, a first lead, and a second lead, wherein the base portion is attached to the mesa with a non-conductive adhesive,
a circuit board disposed on the upper surface of the crossbar; and
a first conductor run and a second conductor run disposed on the circuit board, wherein the first lead of the light emitting diode unit is electrically connected to the first conductor run and the second lead of the light emitting diode unit is electrically connected to the second conductor run.

12. The light fixture of claim 11, the housing comprises a thermally conductive material that is coated with a finish that inhibits the flow of electric current.

13. The light fixture of claim 11, wherein the reflective material is reflective tape.

14. The light fixture of claim 11, further comprising a copper ground plane disposed on top of the circuit board.

15. A light fixture comprising:
a housing having a top, and a bottom, the housing comprising:
a first side and a second side, the first side comprising an inner surface having a substantially straight portion, the second side comprising an inner surface having a substantially straight portion;
a crossbar attached to the substantially straight portion of the first side and to the substantially straight portion of the second side, the cross bar comprising an upper surface and a lower surface, wherein a mesa is defined on the upper surface, the mesa being substantially parallel to the straight portions of the first and second sides of the housing, wherein the upper surface of the crossbar faces the top of the housing and the lower surface of the crossbar faces the bottom of the housing;
a lens including a first end and a second end, the lens being formed with a downward fold at the first end and a downward fold at the second end, the lens being disposed on the top of the housing such that it acts as an end closure;
a cover disposed on the bottom of the housing, wherein the edges of the cover fold upward such that they are oriented in substantially the same direction as the first and second sides of the housing,
wherein the downward end folds of the lens of the housing are constrained by the upwardly folded edges of the cover;
a light emitting diode unit having a lens, a base portion, a first lead, and a second lead, wherein the base portion is attached to the mesa with a non-conductive adhesive;
a circuit board disposed on the upper surface of the crossbar; and
a first conductor run and a second conductor run disposed on the circuit board, wherein the first lead of the light emitting diode unit is electrically connected to the first conductor run and the second lead of the light emitting diode unit is electrically connected to the second conductor run.

16. The light fixture of claim 15, wherein the housing comprises a thermally conductive material that is coated with a finish that inhibits the flow of electric current.

17. A light fixture comprising:
a housing comprising:
a first side and a second side, the first side comprising an inner surface having a substantially straight portion, the second side comprising an inner surface having a substantially straight portion;
a crossbar attached to the substantially straight portion of the first side and to the substantially straight portion of the second side, the cross bar comprising an upper surface and a lower surface, wherein a mesa is defined on the upper surface, the mesa being substantially parallel to the straight portions of the first and second sides of the housing;
a light emitting diode unit having a lens, a base portion, a first lead, and a second lead, wherein the base portion is attached to the mesa with a non-conductive adhesive;

a circuit board disposed on the upper surface of the crossbar; and a first conductor run and a second conductor run disposed on the circuit board, wherein the first lead of the light emitting diode unit is electrically connected to the first conductor run and the second lead of the light emitting diode unit is electrically connected to the second conductor run, wherein the light emitting diode unit is one of a plurality of light emitting diode units, each of which has a base portion that is attached to the mesa with a non-conductive adhesive, each of which has respective first and second leads that are electrically connected to conductor runs.

18. A light fixture comprising:

a housing comprising:
  a first side and a second side, the first side comprising an inner surface having a substantially straight portion, the second side comprising an inner surface having a substantially straight portion;
  a crossbar attached to the substantially straight portion of the first side and to the substantially straight portion of the second side, the cross bar comprising an upper surface and a lower surface, wherein a mesa is defined on the upper surface, the mesa being substantially parallel to the straight portions of the first and second sides of the housing;
a light emitting diode unit having a lens, a base portion, a first lead, and a second lead, wherein the base portion is attached to the mesa with a non-conductive adhesive;
a first circuit board disposed on the upper surface of the crossbar;
a second circuit board disposed on the lower surface of the crossbar, the second circuit board having disposed thereon circuitry; and
a first conductor run and a second conductor run disposed on the circuit board, wherein the first lead of the light emitting diode unit is electrically connected to the first conductor run and the second lead of the light emitting diode unit is electrically connected to the second conductor run, wherein the first and second conductors are electrically connected to the circuitry, the circuitry controlling the intensity of the light emitted by the light emitting diode unit.

19. A light fixture comprising:

a housing comprising:
  a first side and a second side, the first side comprising an inner surface having a substantially straight portion, the second side comprising an inner surface having a substantially straight portion;
  a crossbar attached to the substantially straight portion of the first side and to the substantially straight portion of the second side, the cross bar comprising an upper surface and a lower surface, wherein a mesa is defined on the upper surface, the mesa being substantially parallel to the straight portions of the first and second sides of the housing;
a light emitting diode unit having a lens, a base portion, a first lead, and a second lead, wherein the base portion is attached to the mesa with a non-conductive adhesive;
a circuit board disposed on the upper surface of the crossbar; and a first conductor run and a second conductor run disposed on the circuit board, wherein the first lead of the light emitting diode unit is electrically connected to the first conductor run and the second lead of the light emitting diode unit is electrically connected to the second conductor run, wherein the inner surface of the first side of the housing has an upper angled portion and a lower angled portion, the substantially straight portion being located between the upper angled portion and the lower angled portion, wherein the inner surface of the second side of the housing has an upper angled portion and a lower angled portion, the substantially straight portion being located between the upper angled portion and the lower angled portion, and wherein the housing has a substantially H-shaped cross-section.

20. A light fixture comprising:

a housing comprising:
  a first side, the first side comprising an inner surface and an outer surface, the inner surface of the first side having an upper angled portion, a lower angled portion, and a substantially straight portion disposed between the upper and lower angled portions, the outer surface having a plurality of fins,
  a second side, the second side comprising an inner surface and an outer surface, the inner surface of the second side having an upper angled portion, a lower angled portion, and a substantially straight portion disposed between the upper and lower angled portions, the outer surface having a plurality of fins, wherein the first and second sides are oriented so that their respective inner surfaces face one another and are spaced apart at a distance,
  a crossbar attached to the straight portion of the inner surface of the first side and to the straight portion of the inner surface of the second side such that the crossbar spans the distance, the crossbar having an upper surface with a mesa defined thereon, and a lower surface;
  a lens formed with downward folds at its ends, the lens being disposed on the top of the housing such that it acts as an end closure;
  a cover disposed on the bottom of the housing, wherein the edges of the cover fold upward such that they are oriented in substantially the same direction as the first and second sides of the housing, wherein the downward end folds of the lens of the housing are constrained by the upward end folds of the cover;
a first circuit board disposed on the upper surface of the crossbar, the first circuit board having a first conductor run and a second conductor run, wherein a ground plane disposed on an upper surface of the first circuit board, wherein mounting hardware connects the ground plane to a chassis, and wherein the first and second conductor runs are at least partly shielded from electromagnetic interference by the ground plane;
a light emitting diode unit that is attached to the mesa with a thin layer of adhesive material, the light emitting diode unit having a first lead and a second lead, the first lead being electrically connected to the first conductor run, the second lead being electrically connected to the second conductor run; and
a second circuit board disposed on the lower surface of the crossbar, the second circuit board having control circuitry that controls the intensity of the light emitting diode unit, wherein the first and second conductor runs are electrically connected to the control circuitry.

* * * * *